(12) United States Patent
Melanson

(10) Patent No.: US 6,294,954 B1
(45) Date of Patent: Sep. 25, 2001

(54) ADAPTIVE DEAD TIME CONTROL FOR SWITCHING CIRCUITS

(75) Inventor: John Laurence Melanson, Boulder, CO (US)

(73) Assignee: AudioLogic, Incorporated, Boulder, CO (US)

( * ) Notice: Subject to any disclaimer, the term of this patent is extended or adjusted under 35 U.S.C. 154(b) by 0 days.

(21) Appl. No.: 09/480,274

(22) Filed: Jan. 11, 2000

(51) Int. Cl.$^7$ .................................................. H03F 3/38
(52) U.S. Cl. .................. 330/10; 330/207 A; 327/112; 326/83
(58) Field of Search ................... 330/10, 207 A, 330/251; 327/112, 170, 374, 376, 377; 326/83, 85, 87

(56) References Cited

U.S. PATENT DOCUMENTS

| | | |
|---|---|---|
| 3,510,749 | 5/1970 | Resch . |
| 4,424,557 | 1/1984 | Steigerwald . |
| 4,554,512 * | 11/1985 | Aiello .................................. 330/10 |
| 5,023,150 | 6/1991 | Takabayashi . |
| 5,126,684 | 6/1992 | Solomon . |
| 5,270,904 * | 12/1993 | Gulczynski ........................ 363/97 |
| 5,365,422 | 11/1994 | Close et al. . |
| 5,923,548 | 7/1999 | Kammiller . |
| 5,973,368 * | 10/1999 | Pearce et al. ..................... 257/368 |
| 6,016,075 * | 9/2000 | Hamo .................................. 330/10 |
| 6,118,336 * | 9/2000 | Pullen et al. ....................... 330/10 |

OTHER PUBLICATIONS

EPO Patent Abstract of Japan entitled, "ARM Shortproof Circuit of Transistor Converter," by Tomita Hiroo on behalf of Fuji Electric Co. Ltd. Publication No.: 62272878, Publication Date: Nov. 1987, Application No.: 61112393, Application Date: May 1986.

German Patent No.: DE 197 09 768 C 1 by Patentschrift.

PCT Application entitled, "Cryogenically–Cooled Switching Circuit," by Gold et al. on behalf of American Superconductor Corporation, Publication No.: WO 98/07237, Publication Date: Feb. 1998, Application No.: PCT/US97/13432, Application Date: Jul. 1997.

EPO Patent Abstracts of Japan entitled, "Power Supply," by Hitsuma Shinji on behalf of Matsushita Electric Works Ltd. Publication No.: 11243691, Publication Date: Sep. 1999, Application No.: 10042649, Application Date: Feb. 1998.

EPO Patent Abstracts of Japan entitled, "Power Converter," by Osada Noriaki on behalf of Toshiba Corp. Publication No.: 07007961, Publication Date: Jan. 1995, Application No.: 05142435, Application Date: Jun. 1993.

European Patent Application entitled, "PWM Power Converter," by Nishizawa et al. Publication No.:0284021 A2, Publication Date: Sep. 1988, Application No.: 88104565.2, Application Date: Mar. 1988.

* cited by examiner

*Primary Examiner*—Robert Pascal
*Assistant Examiner*—Henry Choe
(74) *Attorney, Agent, or Firm*—Jennifer L. Bales; Macheledt Bales & Johnson LLP

(57) ABSTRACT

Apparatus for adaptively reducing dead time in a switching circuit includes overlap detection circuitry for measuring the dead time/overlap of the switches, and control circuitry for setting the dead time to the optimum level (generally the minimum possible dead time without any overlap occurring). The dead time/overlap may be detected by measuring the current through the switches, the current into the power supply, the voltage waveform at the switch point, or the average voltage waveform at the switch point. The dead time may be controlled by utilizing delay elements prior to the drivers, or by utilizing circuitry to control the driver timing.

12 Claims, 10 Drawing Sheets

ADAPTIVE DEAD TIME CONTROL FOR SWITCHING CIRCUITS

BACKGROUND OF THE INVENTION

1. Field of the Invention

The present invention relates to apparatus and methods for adaptively reducing dead time in switching circuits.

2. Description of the Prior Art

FIG. 1 (prior art) shows a power output stage, typical for a switching audio amplifier. PWM Control Block 101 is the control circuitry that changes the input (in this case audio) into pulse width modulated control signals. The input may be analog or digital. Drivers 102 and 103 turn on and off the gates of switches 104 and 105. In this case, the switches are FETs, but other active devices may be used. The use of FETs is typical for audio amplification. Filter 106, normally an LC lowpass filter, removes the switching frequencies from the signal. Load 107 receives the power; in the audio case this is a speaker system. Snuber network 108 is optional, and is used to control the switching waveshape. Catch diodes 110 and 111 control the range of voltages during transitions, as filter 106 is usually inductive. These catch diodes are often integrated into transistors 104 and 105.

It is important that output devices 104 and 105 not be on, or in conduction, at the same time, as high current will flow between the supplies and through the devices, causing a lack of efficiency, or even destruction of the devices. A dead time, meaning a time when neither device is on, is used to guarantee this does not occur. FIG. 2 (prior art) illustrates this principal. Each switch 104, 105 is turned off for a period 201 before the other is turned on. Period 201 is called the dead time.

It is important that dead time 201 be as small as possible, without overlap of on signals occurring. During the dead time, the voltage to the filter is not well controlled. This causes distortion in the output. In current designs, using very high drive current in drivers 102 and 103, and making the switching times very short minimizes dead time. This approach has the undesirable effect of increasing the demands on the power supply and wiring, and also emits more RF radiation.

A need remains in the art for apparatus and methods for minimizing the dead time in switching circuits, without causing overlap of the on conduction in the switches.

SUMMARY OF THE INVENTION

Apparatus for adaptively reducing dead time in a switching circuit according to the present invention includes overlap detection circuitry for measuring the dead time/overlap, and control circuitry for setting the dead time to the optimum level (generally the minimum possible dead time without any overlap occurring).

The optimum dead time is set as follows. At the power on of the amplifier, the maximum possible dead time is set. The dead time is then incrementally reduced, and the dead time/overlap is measured at each incremental amount of dead time. When a very small predetermined amount of dead time is sensed, the dead time is set for the circuit.

A current meter may be placed in series with the switches. As the timing is changed from dead time to overlap, there will be a change in the current sensed. The point at the knee of the current versus dead time/ overlap curve will be near optimal in terms of distortion and efficiency. More overlap will give slightly better performance, and lower efficiency. The operating point can be chosen for the desired tradeoffs.

The current sense may be done by sensing the voltage across a small resistor, or by using a current transformer.

As a variant of the current measuring scheme in a multichannel amplifier, a current sensor may be shared between all of the channels by placing it in the common power supply (e.g. to measure current into the power supply). One channel at a time is adjusted.

The voltage waveform at the switch point may also be monitored. The waveform can be digitized by an A/D converter, and the changes in the curve and overshoot monitored to select the desired control.

Another method for using a voltage measurement is as follows. An average value of the output voltage is generated by passing the output through an analog lowpass filter. A waveshape representing the average (filtered) voltage can then be used as a sensitive measure of switch timing.

The control circuitry for setting the dead time to the optimum level may be implemented as follows. A delay element is placed between the PWM circuitry and each driver. The rise and fall delay of each element may be controlled separately by control block. The circuitry may use either a digital delay or an analog delay.

In a second embodiment of the control circuitry, the drive current into each control gate of the switching device is controlled, by controlling the timing of the drivers. The gate of a power FET has very significant capacitance, often storing more than 100 nC of charge. The drive current necessary to charge and discharge this gate charge is significant, often in excess of 1 Amp. The timing of each control gate can be varied by varying the charge and discharge current for the gate. This may be accomplished by using multiple transistors in the drive circuitry, and using logic to control the number of drive transistors in use (turned on). As an example, if four matched devices are used, one device will take approximately four times as long to charge the gate as four devices would. This variable drive can also be used to control the output slew rate, giving further control.

DETAILED DESCRIPTION OF THE PREFERRED EMBODIMENT

Figure 1:
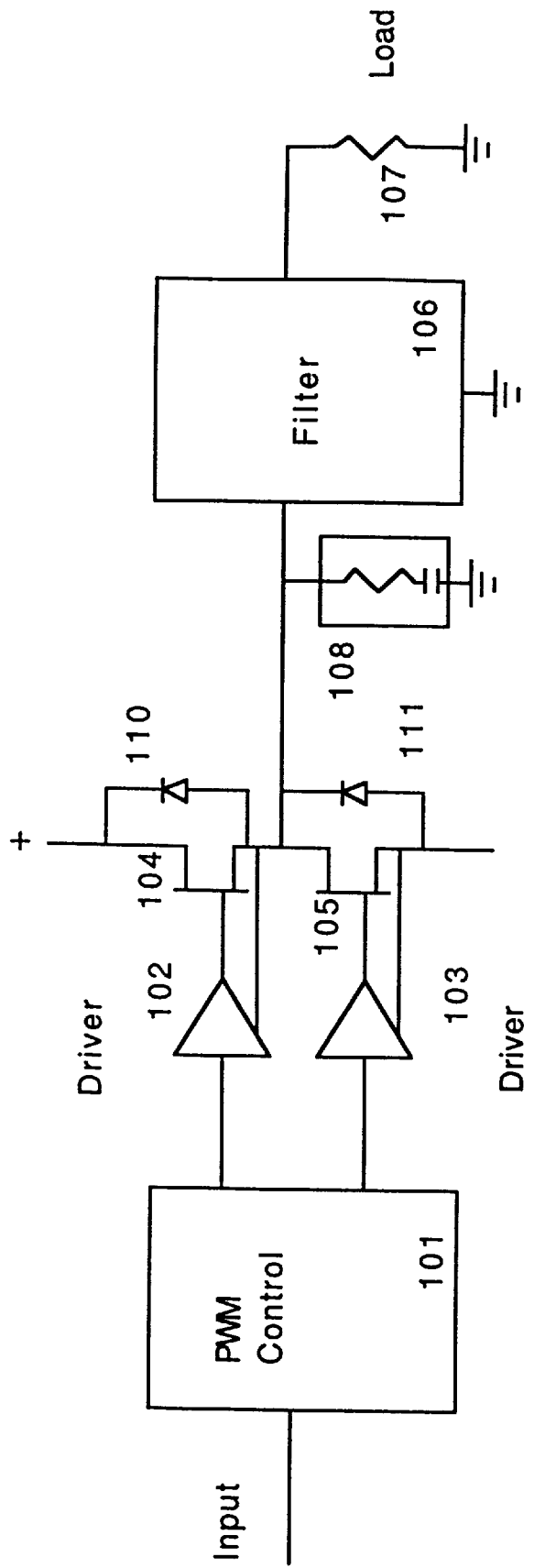
FIG. 1 (prior art) is a block diagram showing a power output stage, typical for a switching audio amplifier.
Figure 2:
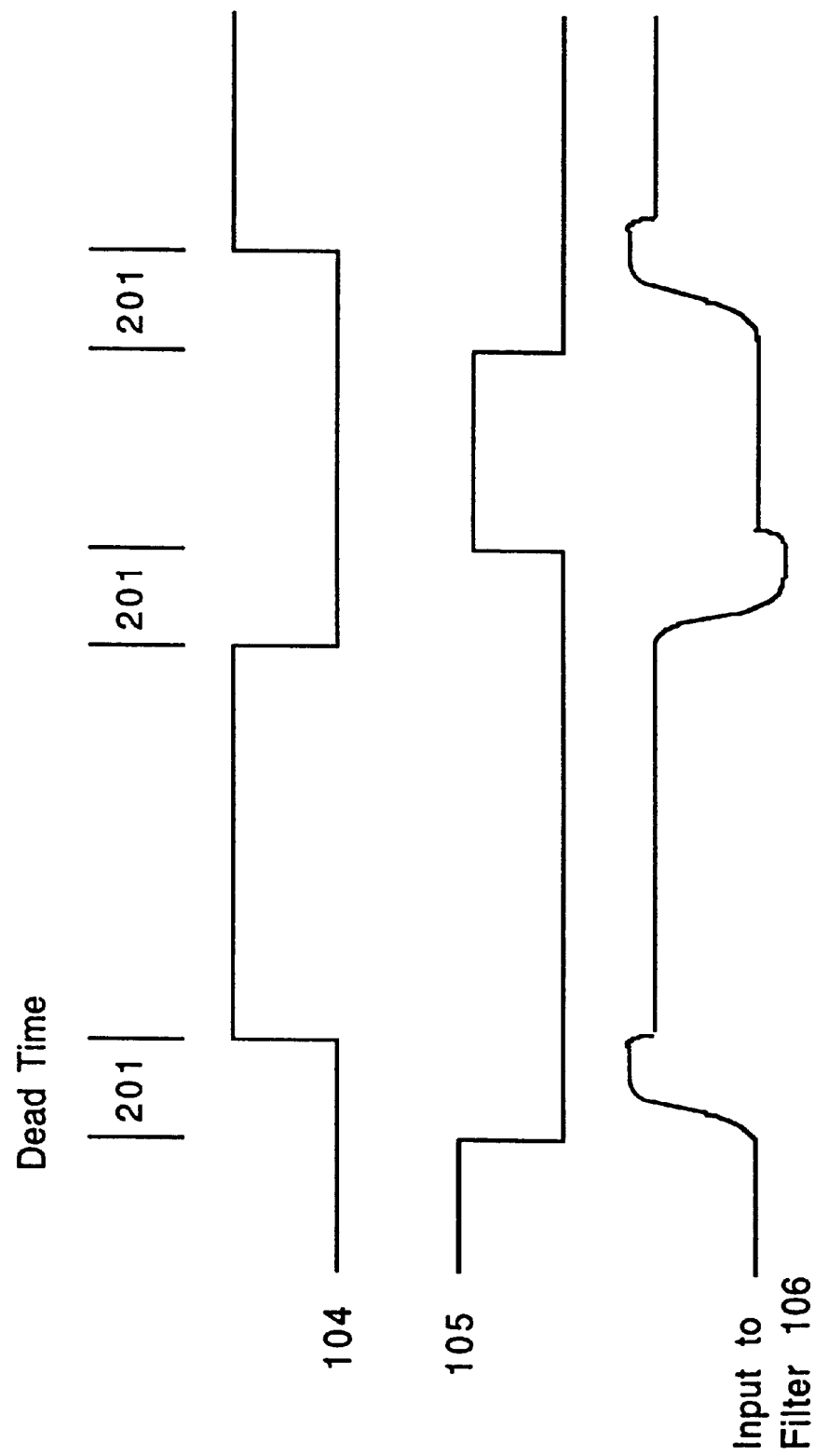
FIG. 2 (prior art) is a timing diagram illustrating the dead time typical of the circuitry of FIG. 1.
Figure 3:
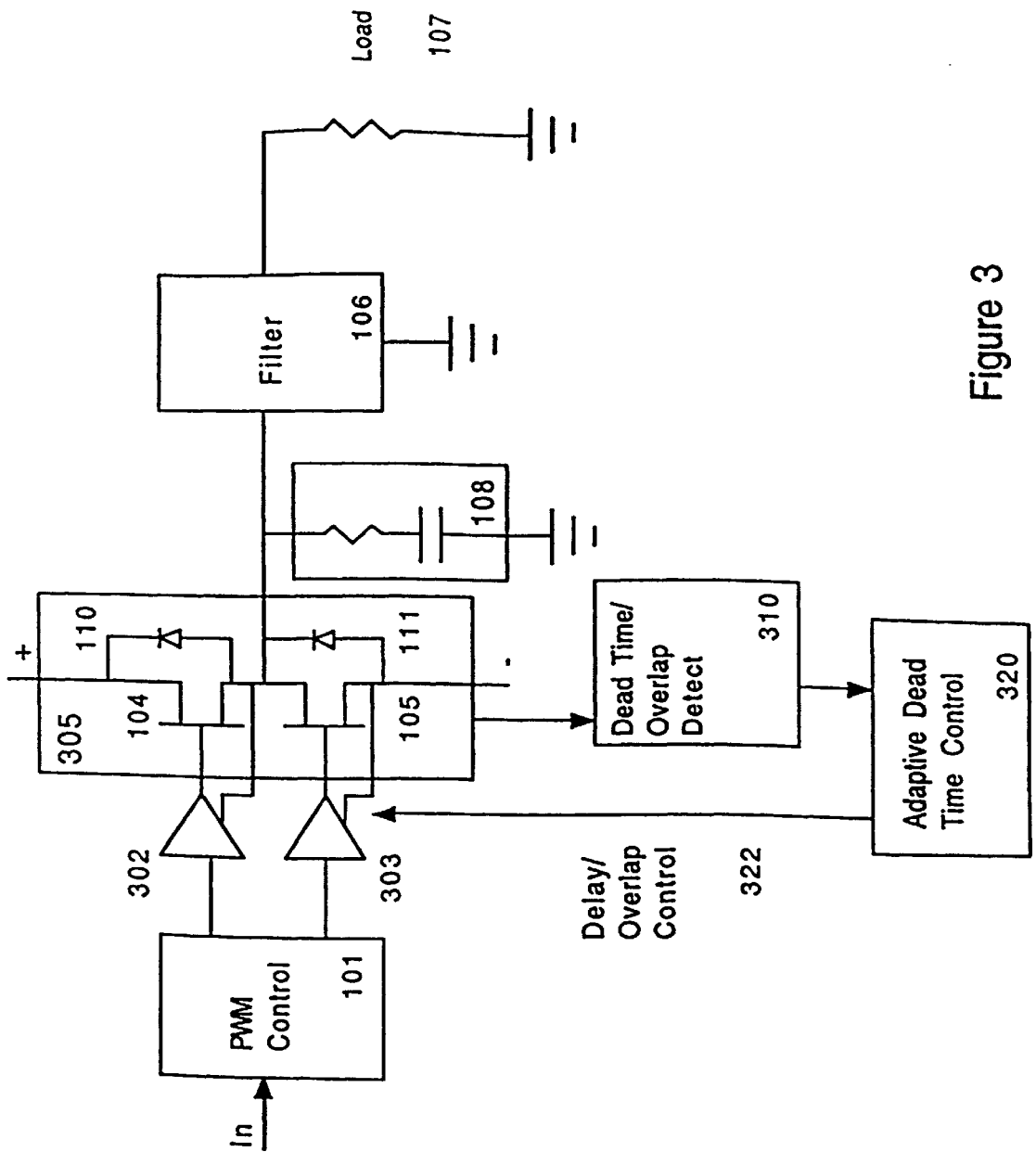
FIG. 3 is a block diagram showing apparatus for adaptively reducing dead time in a switching circuit according to the present invention.

FIG. 3 shows apparatus for adaptively reducing dead time in a switching circuit according to the present invention. The design of FIG. 3 is as in the prior art (see FIG. 1), with the addition of overlap detect block 310 to measure the dead time/overlap from switch block 305, and control means 320 for setting the dead time to the optimum level.

Overlap detect 310 measures the amount of dead time or overlap by measuring some aspect of switch block 305 (see FIGS. 5a, 6, 7a, 8a). Control 320 adjusts the drive control so that the dead time is the minimum possible, without overlap occurring (see FIGS. 9, 10).

Figure 4:
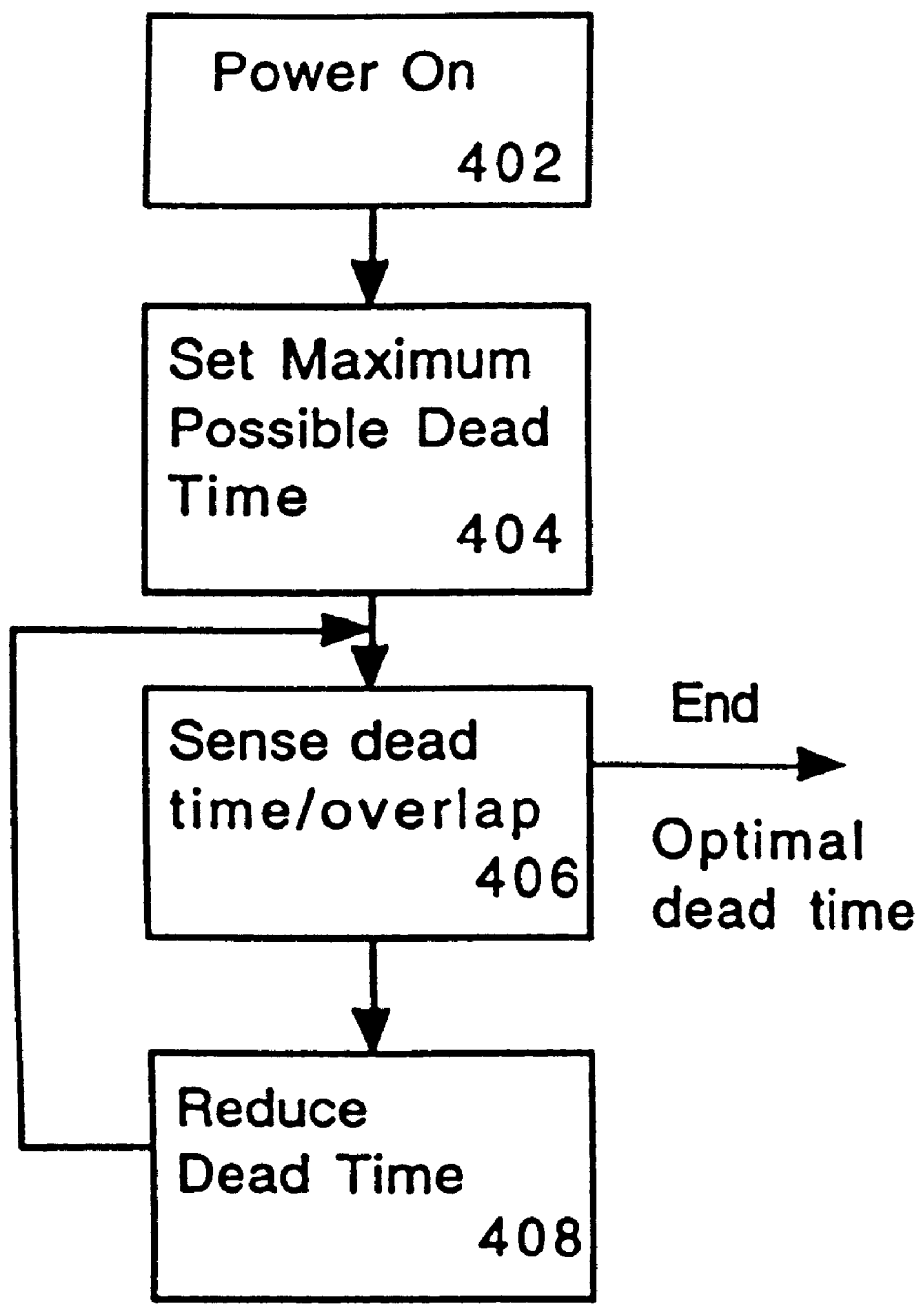
FIG. 4 is a flow diagram illustrating how the apparatus of FIG. 3 might be used to measure and set dead time.

FIG. 4 is a flow diagram illustrating how the apparatus of FIG. 3 might be used to measure and set dead time. On the power on of the amplifier 402, the maximum possible dead time is set in step 404. The dead time is incrementally reduced in block 408, measuring the overlap at each incremental amount of dead time in step 406, until a very small amount of overlap is sensed.

Figure 5A:
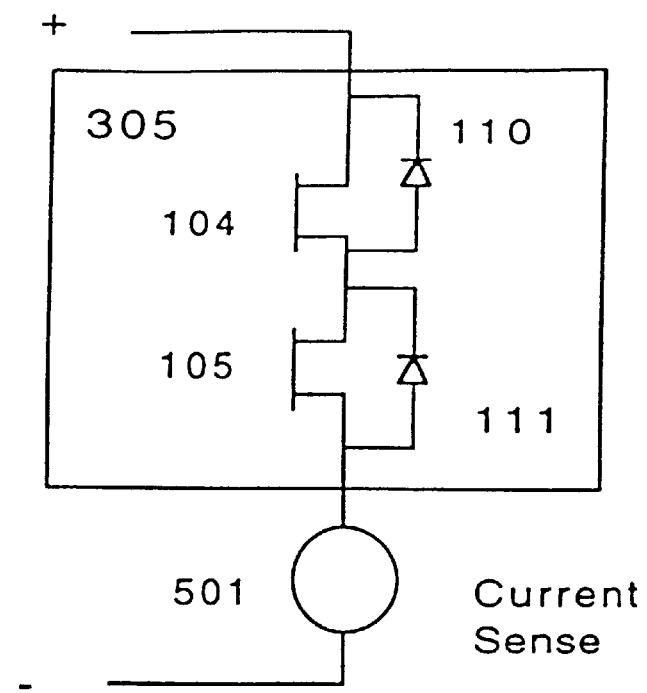
FIG. 5a is a block diagram showing a first method for sensing the dead time/overlap in FIG. 3, involving measuring the current through the switches.
Figure 5B:
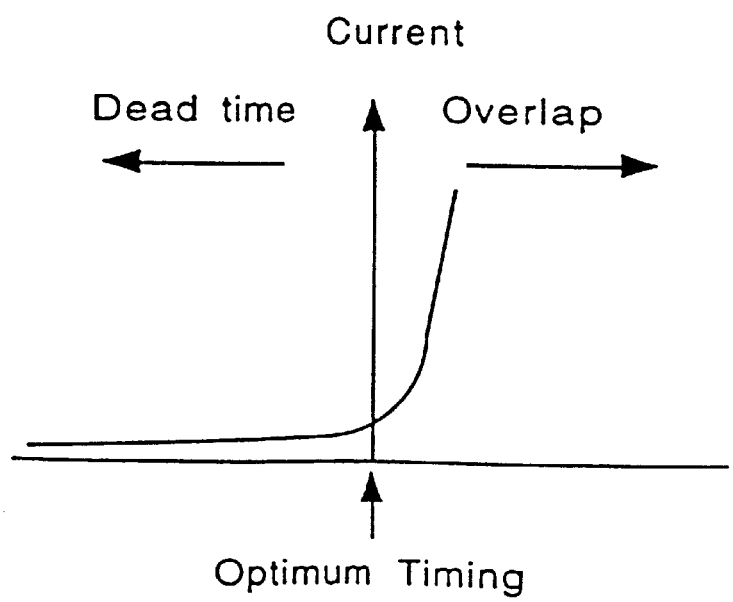
FIG. 5b shows a waveform illustrating the current sensed in FIG. 5a as the timing is changed from dead time to overlap.

FIG. 5a is a block diagram showing a first method for sensing the dead time/overlap. A current meter 501 is placed in series with switches 110, 111 to measure switch block 305 current. As the timing is changed from dead time to overlap, there will be a change in the current sensed, as illustrated in FIG. 5b. The point at the knee of the curve will be near optimal in terms of distortion and efficiency. More overlap will give slightly better performance, and lower efficiency. The operating point can be chosen for the desired performance. The current sense may be accomplished by sensing the voltage across a small resistor, or by using a current transformer. The transformer is a simple solution, as there is no common mode sense problem, and the current pulse occurs at a high frequency.

Figure 6:
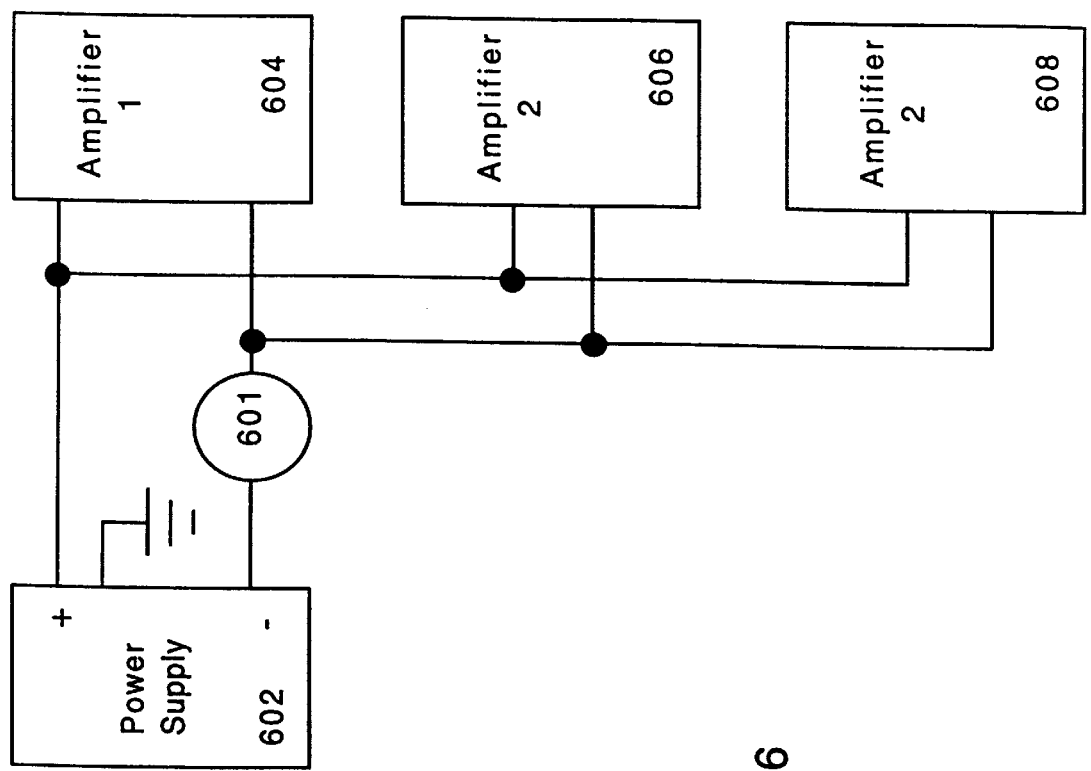
FIG. 6 is a block diagram showing a second method for sensing the dead time/overlap, involving sensing the current into the power supply.

FIG. 6 shows a variant of the current measuring scheme. In a multichannel amplifier, the current sensor 601 may be shared between all of the channels by placing it in the common power supply (e.g. measuring the current into the power supply). One channel at a time is adjusted. In all other senses the operation is identical to that shown in FIG. 5.

Figure 7B:
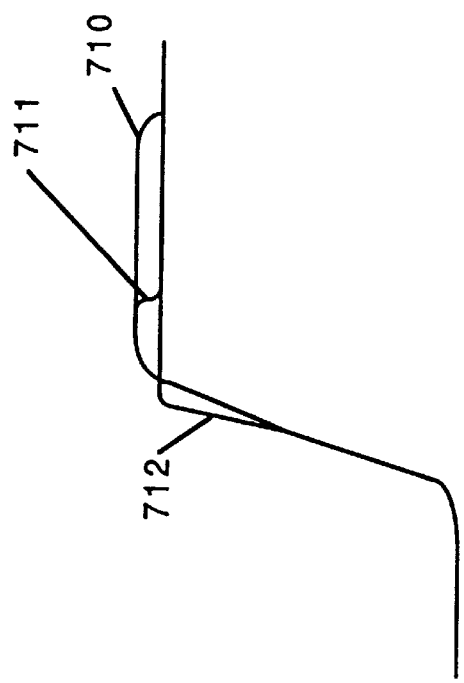
FIG. 7b shows typical voltage waveforms resulting from the circuitry of FIG. 7a as the dead time control is varied.
Figure 7A:
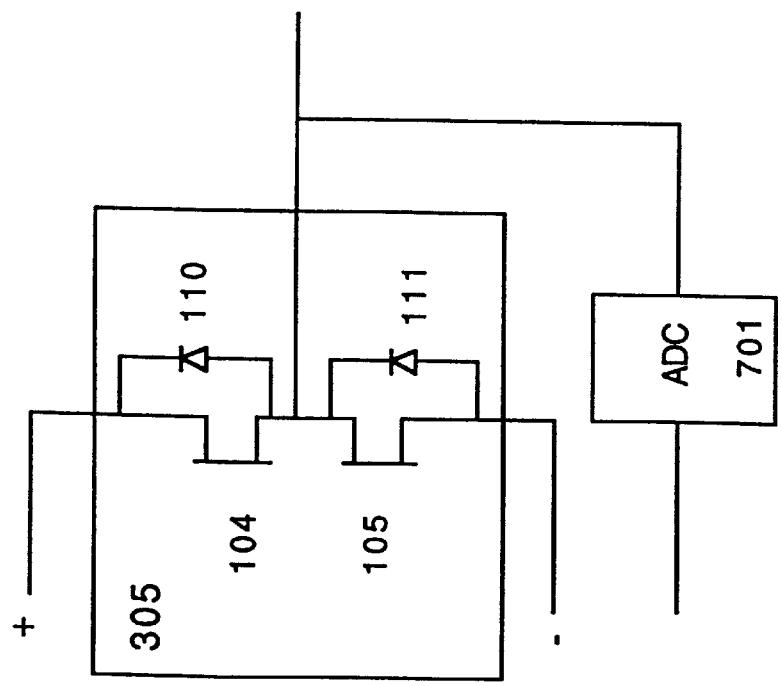
FIG. 7a is a block diagram showing a third method for sensing the dead time/overlap, involving measuring the voltage waveform at the switch point.

A voltage waveform from switch block 305 may also be monitored, as in FIG. 7a. FIG. 7b shows typical waveforms as the dead time/overlap control is varied. Waveform 710 results from a long dead time, waveform 711 results from a shorter dead time, and waveform 712 results from a minimal overlap. The waveform can be digitized by A/D converter 701, and the changes in the curve and overshoot monitored to select the desired control.

Figure 8B:
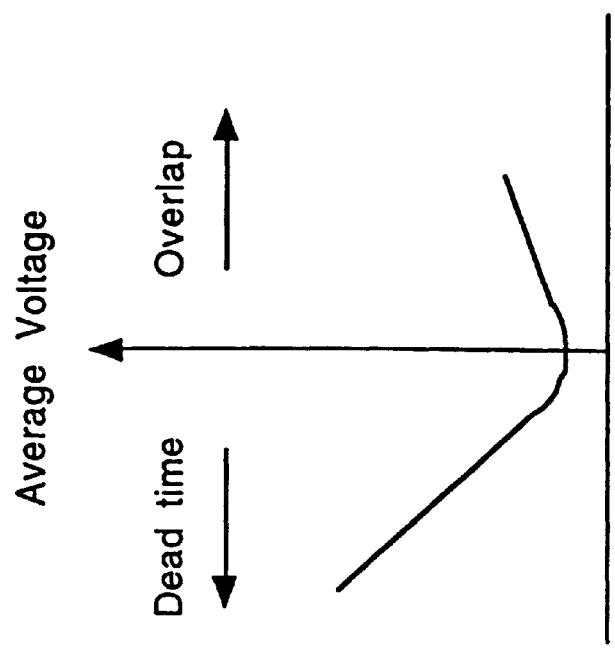
FIGS. 8a and 8b a block diagram and a waveform illustrating fourth method for sensing the dead time/overlap, involving measuring the average voltage at the switch point.
Figure 8A:
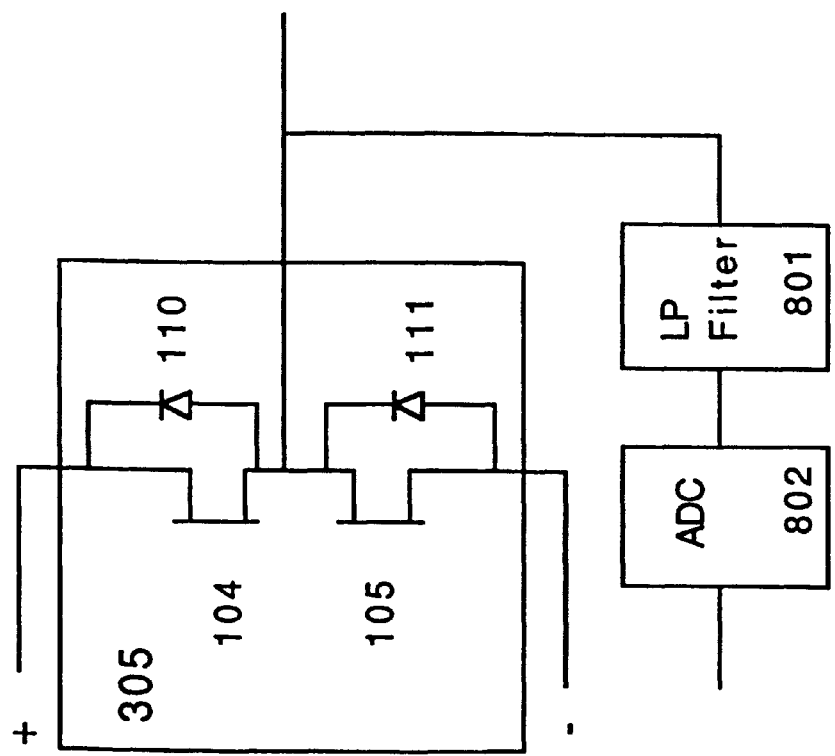

FIG. 8a is a block diagram illustrating another method for measuring a voltage reading from switch block 305 to monitor dead time/overlap. In this case, an average value of the output voltage is generated by analog lowpass filter 801. Analog to Digital converter (ADC) 802 can now be slow, and of limited accuracy. It can be seen from the waveshapes of 7b that as the dead time is first reduced, the average voltage decreases. For example, the average value of waveform 711 is less than that of waveform 710. As the dead time is further reduced, and some overlap is experienced, the average voltage again increases. This average voltage can be used as a sensitive measure of switch timing. FIG. 8b shows a typical average voltage versus switch timing.

Figure 9:
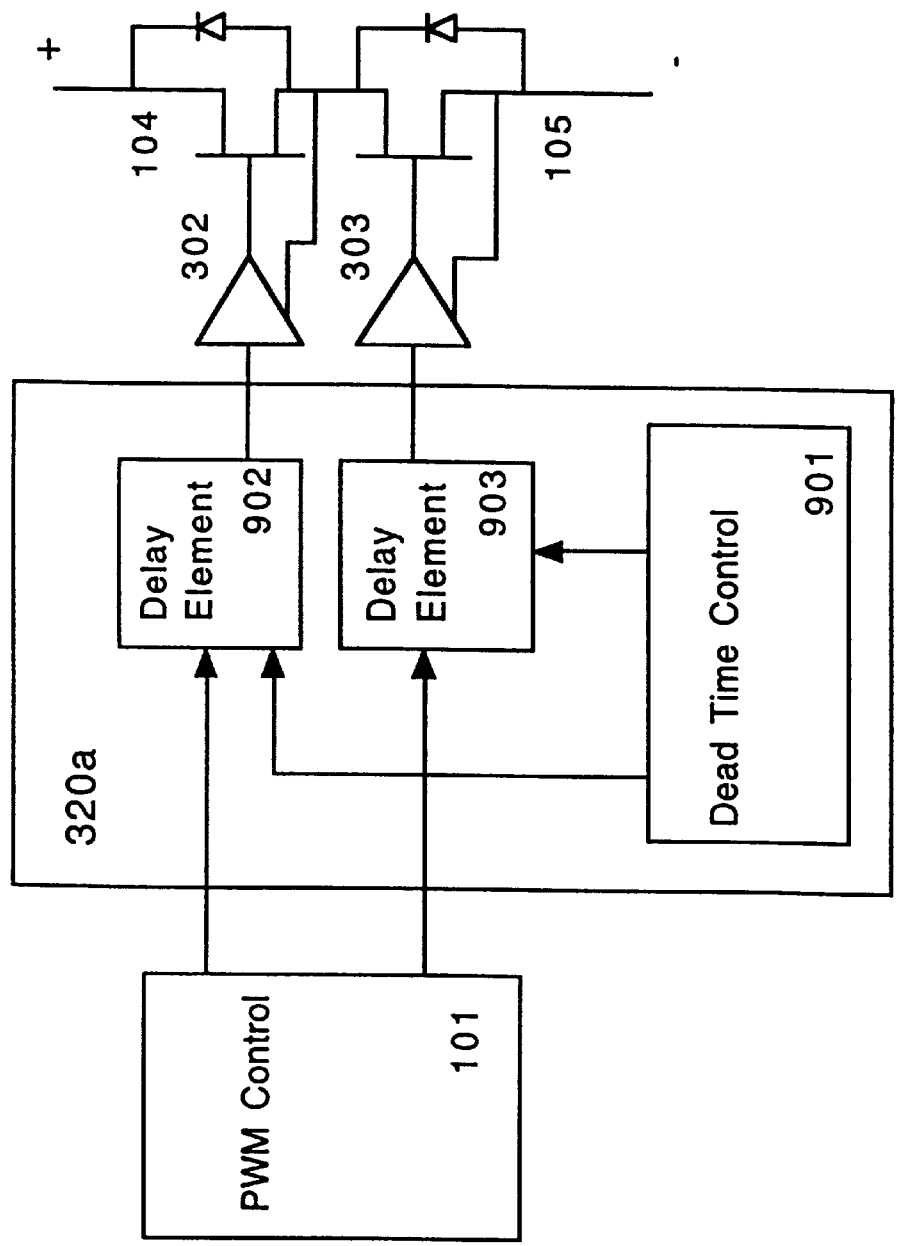
FIG. 9 shows a first embodiment of the control circuitry of FIG. 3, utilizing delay elements prior to the drivers.

FIG. 9 shows a first embodiment of control block 320. A delay element 902, 903 is placed between PWM control circuitry 101 and each driver 302, 303. The rise and fall delay of each element may be controlled separately by control block 901. The circuitry may use a digital delay or an analog delay. It is well known to those versed in the art how to implement such circuitry.

Figure 10:
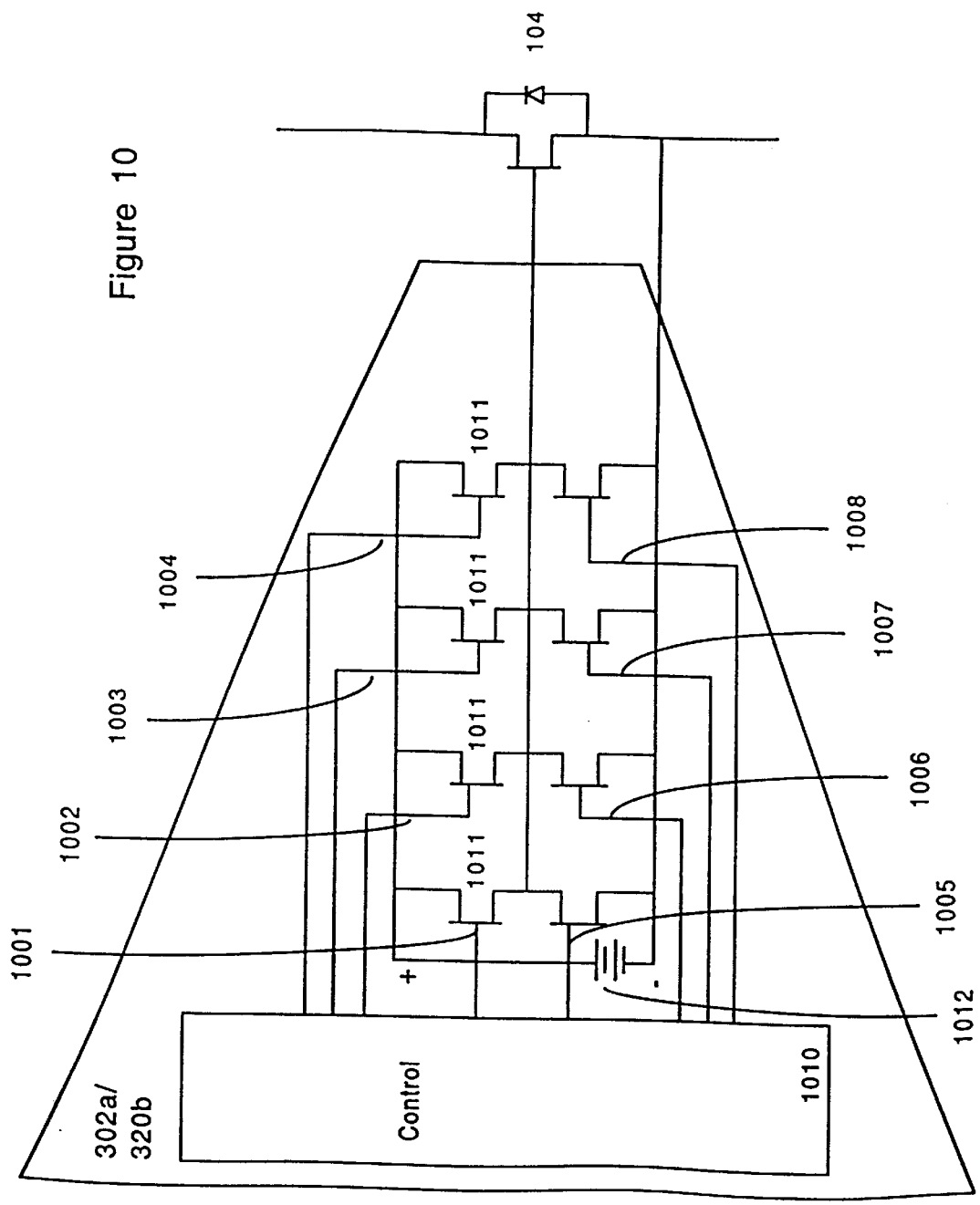
FIG. 10 shows a second embodiment of the control circuitry of FIG. 3, utilizing circuitry to control the driver timing.

FIG. 10 is a block diagram illustrating a second embodiment control block 320. In the second embodiment, the drive current into the control gate 104 of the switching device is controlled, by controlling the timing of gate 302 or 304. The gate of a power FET has very significant capacitance, often storing more than 100 nC of charge. The drive current necessary to charge and discharge this gate charge is significant, often in excess of 1 Amp. The timing can be varied by varying the charge and discharge current for the gate. In the schematic shown, this is accomplished by using multiple transistors 1011 in the drive circuitry, and using logic 1010 to control the number in use (on) via control signals 1001–1008. As an example, if four matched devices 1011 are used, one device will take four times as long to charge the gate as four devices would. This variable drive can also be used to control the output slew rate, giving further control. Drive voltage 1012 is typically 12–15 volts.

While the exemplary preferred embodiments of the present invention are described herein with particularity, those skilled in the art will appreciate various changes, additions, and applications other than those specifically mentioned, which are within the spirit of this invention.

What is claimed is:

1. Apparatus for adaptively reducing dead time (delay between one switch turning off and the other turning on) in a switching circuit having a power supply and two output power switches, the apparatus comprising:
    overlap detection circuitry for measuring the amount of dead time or overlap between the two switches;
    wherein the overlap detection circuitry determines whether each switch is on or off;
    control circuitry for varying the dead time between the two power switches; and
    optimization means for setting the dead time between the two switches to a predetermined optimum period via the control circuitry.

2. The apparatus of claim 1, wherein the overlap detection circuitry comprises:
    a current meter placed in series with one of the switches for measuring the current in that switch; and
    means for calculating the relative amount of dead time or overlap based upon the measured current.

3. The apparatus of claim 2, wherein the means for calculating dead time detects a knee in a plot of current versus dead time, and wherein the optimization means sets the dead time at the knee.

4. The apparatus of claim 1, wherein the overlap detection circuitry comprises:
    a current meter placed in series with a terminal of the power supply for measuring the current through the power supply; and
    means for calculating the relative amount of dead time or overlap based upon the measured current.

5. The apparatus of claim 4, wherein the means for calculating dead time detects a knee in a plot of current versus dead time, and wherein the optimization means sets the dead time at the knee.

6. The apparatus of claim 5, wherein the power supply powers a plurality of switching circuits according to claim 1, and wherein the control circuitry for each switch varies the amount of dead time in that switch separately.

7. The apparatus of claim 1, wherein the overlap detection circuitry comprises:

a voltage meter placed at the output of switching circuit; and means for calculating the amount of dead time or overlap based upon the measured voltage.

8. The apparatus of claim 7, wherein the means for calculating dead time monitors plots of the voltage versus time curve for a plurality of dead times, and selects the dead time based upon the plots.

9. The apparatus of claim 7, further including a low pass filter prior to the voltage meter, and wherein the means for calculating the amount of dead time or overlap calculates the dead time or overlap based upon the average measured voltage.

10. The apparatus of claim 1, wherein the control circuitry for varying the dead time between the two power switches comprises:

means for varying the amount of current into the switch controls.

11. The apparatus of claim 1, wherein the control circuitry for varying the dead time between the two power switches comprises:

a variable delay element placed in series before one of the switches for inducing a variable amount of delay; and delay control means for varying the amount of delay induced by the delay element.

12. A method for adaptively reducing dead time (delay between one switch turning off and the other turning on) in a switching circuit having a power supply and two output power switches, the method comprising the steps of:

measuring the amount of dead time or overlap between the two switches;

wherein the measuring step determines whether each switch is on or off;

varying the dead time between the two power switches; and setting the dead time between the two switches to a predetermined optimum period.

* * * * *

UNITED STATES PATENT AND TRADEMARK OFFICE
CERTIFICATE OF CORRECTION

PATENT NO.    : 6,294,954 B1
DATED         : September 25, 2001
INVENTOR(S)   : John L. Melanson It is certified that error appears in the above-identified patent and that said Letters Patent is hereby corrected as shown below:

<u>Title page,</u>
Below Item [22], add:

-- Related U.S Application Data
[60] Provisional application No. 60/155,635, filed on September 23, 1999. --

Signed and Sealed this

Twenty-third Day of July, 2002

*Attest:*

*Attesting Officer*

JAMES E. ROGAN
*Director of the United States Patent and Trademark Office*